United States Patent
Okan et al.

(10) Patent No.: US 12,091,355 B2
(45) Date of Patent: Sep. 17, 2024

(54) ANTIMICROBIAL COATING SOLUTION DEVELOPED FOR GLASS SURFACES, ANTIMICROBIAL COATED GLASS AND THE APPLICATION PROCESS THEREOF

(71) Applicant: TURKIYE SISE VE CAM FABRIKALARI ANONIM SIRKETI, Istanbul (TR)

(72) Inventors: Osman Burak Okan, Kocaeli (TR); Refika Budakoglu, Kocaeli (TR); Burcu Apak, Istanbul (TR); Nihat Unal, Kocaeli (TR)

(73) Assignee: TURKIYE SISE VE CAM FABRIKALARI ANONIM SIRKETI, Istanbul (TR)

( * ) Notice: Subject to any disclaimer, the term of this patent is extended or adjusted under 35 U.S.C. 154(b) by 79 days.

(21) Appl. No.: 18/014,182

(22) PCT Filed: Mar. 22, 2021

(86) PCT No.: PCT/TR2021/050254
§ 371 (c)(1),
(2) Date: Jan. 3, 2023

(87) PCT Pub. No.: WO2022/005416
PCT Pub. Date: Jan. 6, 2022

(65) Prior Publication Data
US 2023/0322615 A1 Oct. 12, 2023

(51) Int. Cl.
*C03C 17/25* (2006.01)
*C23C 16/40* (2006.01)

(52) U.S. Cl.
CPC ............ *C03C 17/25* (2013.01); *C23C 16/407* (2013.01); *C03C 2217/23* (2013.01)

(58) Field of Classification Search
None
See application file for complete search history.

(56) References Cited

U.S. PATENT DOCUMENTS

| | | | | |
|---|---|---|---|---|
| 2,957,785 A | * | 10/1960 | Leatherland | D06M 13/51 427/337 |
| 4,187,336 A | | 2/1980 | Gordon | |

(Continued)

FOREIGN PATENT DOCUMENTS

| | | |
|---|---|---|
| CN | 101693601 A | 4/2010 |
| CN | 102923966 A | 2/2013 |

(Continued)

OTHER PUBLICATIONS

Duygu Guldiren, et al., Influence of silver and potassium ion exchange on physical and mechanical properties of soda lime glass, Journal of Non-Crystalline Solids, 2016, pp. 1-9, vol. 441.

(Continued)

*Primary Examiner* — Alexander M Weddle
(74) *Attorney, Agent, or Firm* — Bayramoglu Law Offices LLC

(57) ABSTRACT

An antimicrobial coating solution developed to be used on glass surfaces is provided. In an alcohol and/or water environment, the antimicrobial coating solution includes at least one copper salt in a hydrate form and at least one tin source. A process of applying the antimicrobial coating solution to a complex shaped glass surface is further provided. The antimicrobial coating solution is configured to be applied to the complex shaped glass surface when a temperature of the complex shaped glass surface is 400° C. and higher. The complex shaped glass surface is a flat glass or a glassware.

9 Claims, 3 Drawing Sheets

(56) References Cited

U.S. PATENT DOCUMENTS

| | | | |
|---|---|---|---|
| 5,401,305 A | | 3/1995 | Russo et al. |
| 6,153,648 A | * | 11/2000 | Makino .................. A01N 37/44 |
| | | | 570/189 |
| 6,165,256 A | * | 12/2000 | Hayakawa ............... B01J 35/39 |
| | | | 106/287.18 |
| 9,011,890 B2 | * | 4/2015 | Wang ...................... C03C 17/25 |
| | | | 424/404 |

FOREIGN PATENT DOCUMENTS

| | | |
|---|---|---|
| EP | 0755902 A2 | 1/1997 |
| GB | 2252332 A | 8/1992 |
| JP | H09132432 A | 5/1997 |
| WO | 2006064059 A1 | 6/2006 |
| WO | 2015091261 A1 | 6/2015 |
| WO | 2017132179 A1 | 8/2017 |

OTHER PUBLICATIONS

ISO 22196, Plastics—Measurement of antibacterial activity on plastics surfaces, International Standard, 2007, pp. 1-16.
ISO 21702, Measurement of antiviral activity on plastics and other non-porous surfaces, International Standard, 2019, pp. 1-20.
A.M.B. Van Mol, et al., Chemical vapor deposition of tin oxide: Fundamentals and applications, Thin Solid Films, 2006, pp. 72-78, vol. 502.

* cited by examiner

ANTIMICROBIAL COATING SOLUTION DEVELOPED FOR GLASS SURFACES, ANTIMICROBIAL COATED GLASS AND THE APPLICATION PROCESS THEREOF

CROSS REFERENCE TO THE RELATED APPLICATIONS

This application is the national phase entry of International Application No. PCT/TR2021/050254, filed on Mar. 22, 2021, which is based upon and claims priority to Turkish Patent Application No. 2020/10598, filed on Jul. 3, 2020, the entire contents of which are incorporated herein by reference.

TECHNICAL FIELD

The invention, in particular, relates to a coating solution applicable to hot glass for forming transparent thin film layers having a permanent antimicrobial effect on use on glass products, the glass product coated with this solution and its production method.

BACKGROUND

The ion exchange method is one of the most commonly used methods to obtain antimicrobial properties in glasses. Here, a permanent antibacterial effect can be observed as a result of the replacement of glasses immersed in salt melts containing ions such as $Ag^+$ and $Cu^{+1/+2}$ with free ions in the glass matrix. The high ionic mobility of $Ag^+$ ions in silicate glasses causes the said ion to be released into the environment. As a result of continuous release to the environment, the antibacterial effect inevitably decreases over time. The simultaneous presence of secondary metals such as Zn and Cu with Ag limits this release but does not eliminate it (D. Güldiren, İ. Erdem and S. Aydin, "Influence of silver and potassium ion exchange on physical and mechanical properties of soda lime glass," *Journal of Non-crystalline Solids*, vol. 441, pp. 1-9, 2016.). The release of metal ions is expected to be minimized in products with food contact. Additionally, even though ion exchange by immersion can be applied to all glasses regardless of shape, it is not suitable for the mass production of glasses produced with float technology, glassware and glass packaging applications since it occurs very slowly at high temperatures.

In coating applications, the use of semiconductor layers with wide bandgap such as $TiO_2$ doped with different elements and with or without photocatalytic properties is prominent.

In the patent publication numbered WO 2015/091261, a $TiO_2$ layer with active photocatalytic properties in the visible region doped with F and Cu is described. This coating, which is applied to cold glass as Sol-Gel based and requires a second high-temperature annealing/firing process, can provide a permanent antimicrobial effect, but it brings additional production costs and complicates the production process compared to on-line coatings. Since $TiO_2$ is among the photocatalytic materials with the highest refraction index (2.5-2.6, although it varies with crystallinity), it needs to be coated very thinly to control unwanted reflections in applications on soda-lime silicate glasses.

The patent publication numbered WO2017132179 discloses an antimicrobial product having a matrix containing a polymeric material and an antimicrobial composite region containing a plurality of particles in the matrix. The antimicrobial composite region may be a film containing a first plurality of particles in the form laminated to a substrate. Said first multiple particles can be pressed onto a batch or a film to define the antimicrobial composite region. An exposed surface portion of the antimicrobial composite region may allow a decrease in the concentration of at least one of *Staphylococcus aureus*, *Enterobacter aerogenes*, and *Pseudomonas aeruginosa* bacteria under a Modified EPA Copper Test Protocol by at least log 2.

The invention publication numbered WO2006064059 describes the production process of a substrate with antimicrobial properties. Said process consists of positioning a precursor layer in the form of metal, colloid, chelate, or ion on at least one of the surfaces of the glass substrate and a metal layer containing an inorganic antimicrobial substance and non-gelling on said precursor layer. Said inorganic antimicrobial layer is diffused to at least one surface of the substrate by heat treatment. Alternatively, the glass substrate can be coated with a bottom layer or a top layer. Diffusion takes place between the said coating and this bottom or top layer.

SUMMARY

The present invention relates to the antimicrobial coating solution developed to be applied on a glass substrate, the process of applying the said solution to the glass substrate, and the glass on which the said antimicrobial solution is applied to bring new advantages to the related technical field.

The main purpose of the invention is to provide an antimicrobial coating which endows antimicrobial properties to the glass surface on which it is applied.

Another object of the invention is to provide an antimicrobial coating with increased permanence on the applied surface.

Another object of the invention is to provide a coating that provides high light transmittance and optical clarity to be maintained on the applied surfaces.

Another object of the invention is to provide an antimicrobial coating with the minimized surface release of chemical components.

Another object of the invention is to provide an antimicrobial coating that does not create an iridescence effect on the applied surface.

Another object of the invention is to provide a heat-treatable antimicrobial coating.

Another object of the invention is to provide an antimicrobial coating with high mechanical resistance.

Another object of the invention is to provide an antimicrobial coating with high chemical resistance.

Another object of the invention is to provide an antimicrobial coating method in which the concentration of the chemical components on the coating surface can be adjusted at the desired level.

The present invention is an antimicrobial coating solution developed for use on glass surfaces, to fulfill all the objectives mentioned above and that will emerge from the detailed description below. Accordingly, the feature of the present invention is that in the environment of alcohol and/or water, it comprises at least one copper salt in hydrate form, and at least one tin source.

A preferred embodiment of the invention is that the copper salt comprises at least one of copper(II) sulfate, copper(II) chloride, copper(II) nitrate, or a mixture thereof in a certain proportion.

Another preferred embodiment of the invention is that the tin source comprises at least one of monobutyltin trichloride, tin tetrachloride, dibutyltin diacetate (DBTDA), or a mixture thereof in a certain proportion.

Another preferred embodiment of the invention is that it is suitable for application by pyrolytic spray or atmospheric chemical vapor settling methods.

The present invention is the process of applying the aforementioned solution to a complex shaped glass surface such as flat glass and glassware, to achieve all the objectives mentioned above and that will emerge from the detailed description below. Accordingly, the feature of the present invention is that it can be applied to the glass surface when the glass surface temperature is 400° C. and higher.

A preferred embodiment of the invention is that it can be applied to the glass surface from a single or multiple feeding ports.

Another preferred embodiment of the invention is that the tin source and the copper source are delivered to the glass surface by separate channels in the multiple feeding port application.

To fulfill all the objectives mentioned above and that will emerge from the detailed description below, the present invention relates to antimicrobial coatings developed to be applied to glass surfaces. Accordingly, the feature of the present invention is that it contains at least one copper salt in hydrate form and at least one source of tin.

A preferred embodiment of the invention is that the copper salt comprises at least one of copper(II) sulfate, copper(II) chloride, copper(II) nitrate, or a mixture thereof in a certain proportion.

Another preferred embodiment of the invention is that the tin source comprises at least one of monobutyltin trichloride, tin tetrachloride, or a mixture thereof in a certain proportion.

Another preferred embodiment of the invention is that the tin source contains dibutyl tin diacetate.

A preferred embodiment of the invention is that the coating thickness in flat glass applications is at most 200 nm.

Another preferred embodiment of the invention is that the coating thickness in glassware applications is at most 20 nm.

Another preferred embodiment of the invention is that it is in the form of an oxide.

Another preferred embodiment of the invention is that there is no chemical released from the coating surface to the environment.

Another preferred embodiment of the invention is that it can be tempered.

Another preferred embodiment of the invention is that the antibacterial effect against *Escherichia coli* and *S. aureus* bacteria is at least 90% according to the ISO 22196 standard.

Another preferred embodiment of the invention is that the viral reduction for Poliovirus Type-1, Adenovirus Type-5, Murine Norovirus Type 1 S99, and B. Coronavirus viruses are at least 90% according to the ISO 21702 standard.

DETAILED DESCRIPTION OF THE EMBODIMENTS

Figure 1:
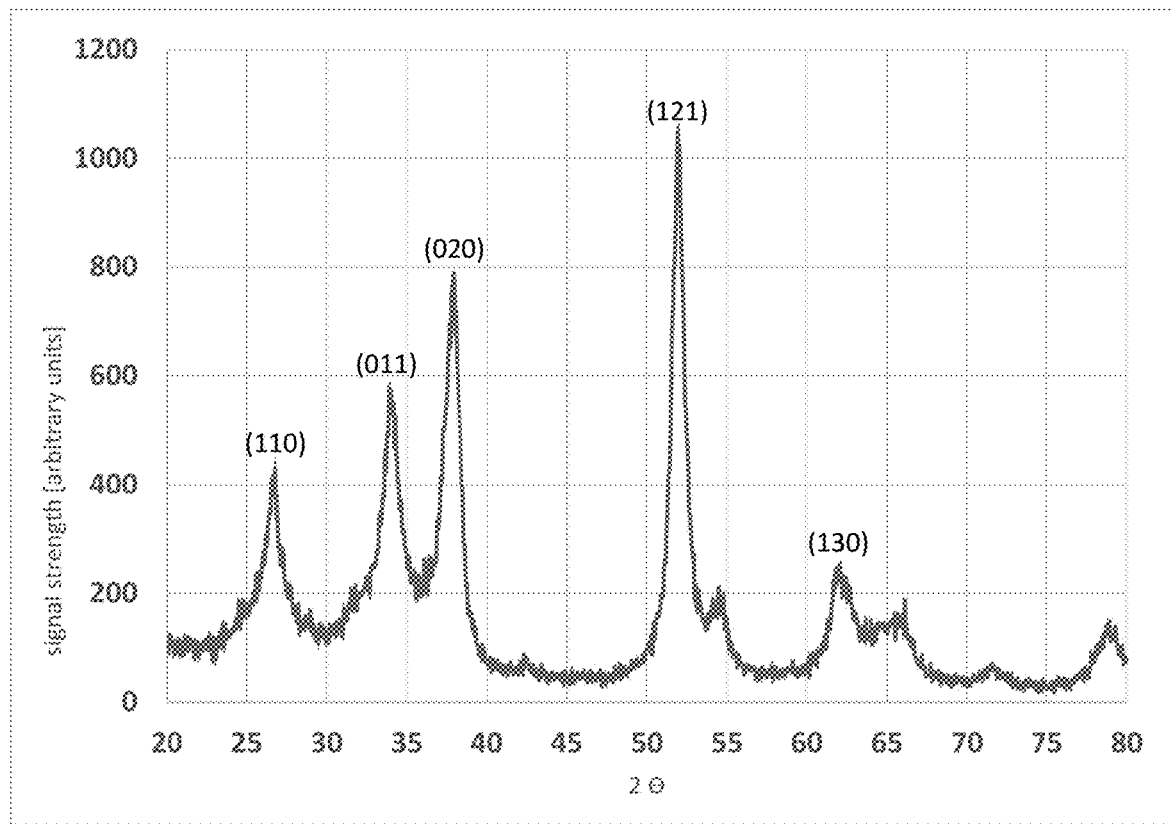
FIG. 1 shows the XRD analysis of the flat glass sample coated with a solution containing tin and copper.
Figure 2A:
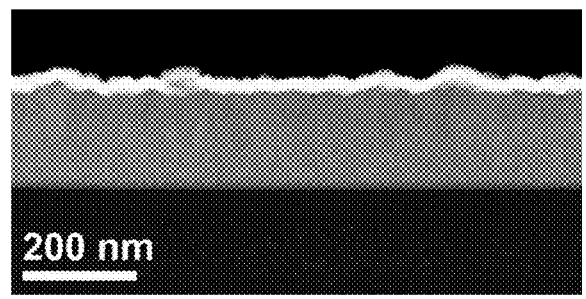
FIGS. 2A-2C show the cross-section STEM analysis of the coating and STEM-EDX map of tin and copper across the coated flat glass example (magnification: 50 kx).
Figure 2B:
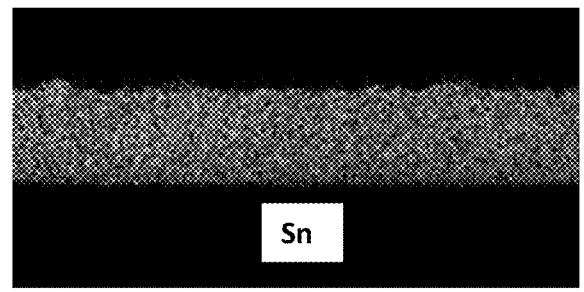
Figure 2C:
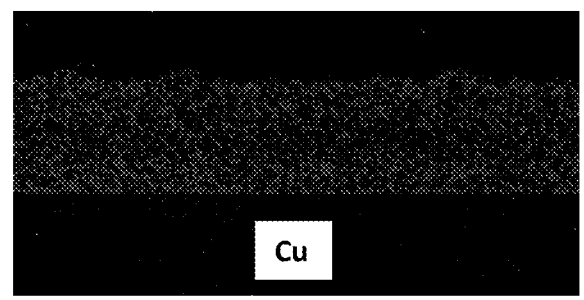
Figure 3A:
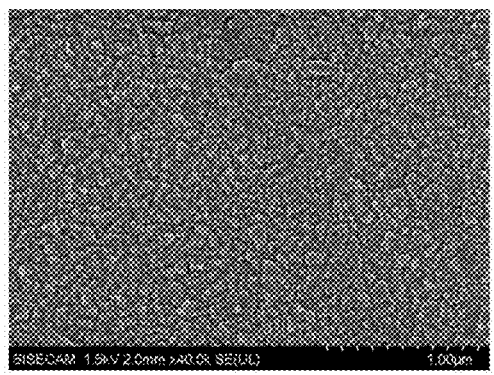
FIGS. 3A-3D show the surface FEG-SEM images of the copper doped tin oxide coated flat glass sample taken at different magnifications (40 kx, 70 kx, 100 kx ve 120 kx).
Figure 3B:
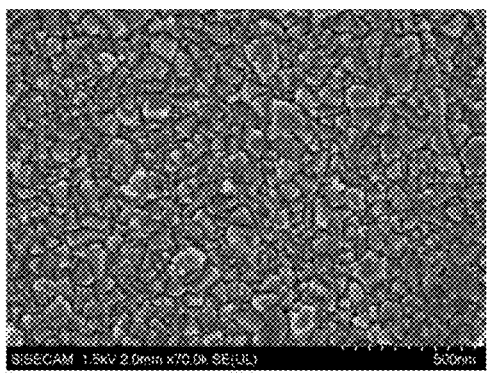
Figure 3C:
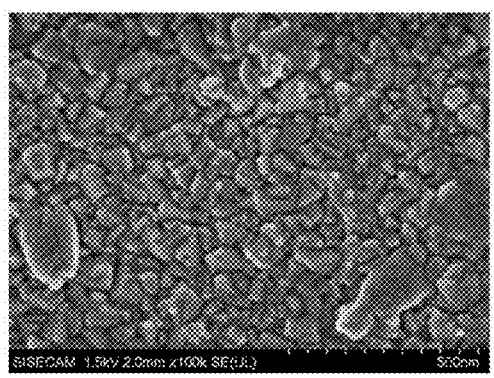
Figure 3D:
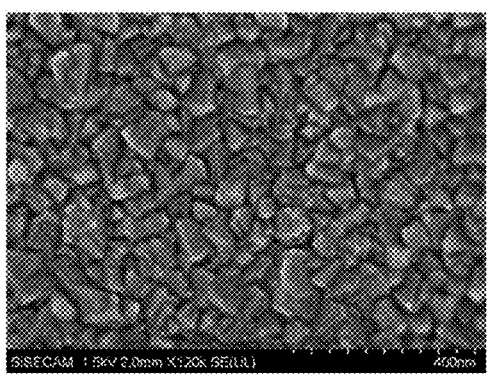

In this detailed description, the antimicrobial coating solution of the invention and the method of application to glass and coated glass are explained only with examples that do not have any limiting effect for a better understanding of the subject matter.

Agents that prevent bacterial growth on surfaces are called "antibacterial" and agents that prevent virus growth are called "antiviral", and agents that prevent fungal growth are called "antifungal". Antimicrobial materials are defined as surfaces that show activity on different microorganisms such as bacteria, viruses, and mold/fungus. Viruses, bacteria and fungi differ from each other in terms of physical size, structural complexity, genetic material, metabolic activity, and reproduction traits. The antimicrobial property described in the present invention is defined as the simultaneous occurrence of antiviral and antibacterial effects.

ISO 21702 (Measurement of antiviral activity on plastics and other non-porous surfaces) standards were used to measure antiviral activity numerically, and ISO 22196 (Measurement of antibacterial activity on plastics and other non-porous surfaces) standards were used to measure antibacterial activity.

The present invention relates to tin oxide-based thin-film coatings with high optical transmittance and permanent antimicrobial effect and their chemical formulations and the application of this coating on a glass substrate. In the coating obtained with the solution of the invention, in addition to its antimicrobial property, it is ensured that there is no or minimum level of chemical release. In the alternative embodiment, the chemical and mechanical strength of the coating with the same property has been increased.

In the environment of water and/or alcohol, the solution of the invention comprises;

At least one copper salt selected from copper(II) sulphate, copper(II) chloride, copper(II) nitrate in hydrate form at a ratio of 5-15% by weight, or its mixtures in a certain ratio;

At least one tin source selected from monobutyltin trichloride (MBTC), tin tetrachloride, dibutyltin diacetate (DBTDA) at a ratio of 20-40% by weight, or its mixtures in a certain ratio.

Ethanol is preferably used as the carrier alcohol.

The obtained solution is obtained by first dissolving the salt components in water or water and alcohol mixed medium and then adding the tin source into the solution. If water and alcohol are used together, alcohol and tin sources are added to the solution after the salt components have been dissolved in water. Thus, the solution is ensured to be optically clear, with no phase separation or precipitation occurring.

The obtained solution can be applied to glass samples that are formed at high temperatures or flat directly under atmospheric conditions. The pyrolytic spray is used in one embodiment of the invention. In another embodiment of the invention, the atmospheric chemical vapor settling method is used.

During the production of coated glass, in cases that the ambient temperature is 400° C. and higher, the solution can be applied directly to the glass surface by using pyrolytic spray or chemical vapor settling techniques, and thus on-line coatings are obtained. Chemical vapor settling reactors can have laminar or turbulent flows. The solution is preferably applied to the glass surface when the glass surface is between 400° C.-650° C. When the solution is applied to the on-line glass surface at the ambient temperature between 400° C.-650° C., the solution content is decomposed and a thin film layer in the oxide structure is formed by combining with the oxygen in the environment. Even if the solution components are fed from separate ports, a homogeneous reactant atmosphere can be created and a homogeneous layer can be formed on the glass surface.

Depending on the selected composition, the starting components can be applied to the glass surface in single or multiple ports. Multiple port application is preferred, especially when using a direct water-immiscible tin source (for example, Dibutyltin diacetate) or when a higher concentration of copper on the surface is desired. In multiple applications, the tin-containing mixture can be applied from one port and the copper-containing mixture dissolved in water and/or alcohol can be applied on another port simultaneously to the glass surface. For monobutyltin trichloride and tin tetrachloride, the presence of water in the reactant atmosphere is known to increase the growth rate of the oxide layer (A. B. M. van Mol, Y. Chae, A. H. McDaniel and M. D. Allendorf, "Chemical vapor deposition of tin oxide: Fundamentals and applications," *Thin Solid Films*, vol. 502, pp. 72-78, 2006). Thereby, coating homogeneity problems caused by the presence of water and variable glass surface temperatures can also be minimized.

According to the thin film XRD results in FIG. 1, the chemical framework of the final layer is mostly a tin oxide layer in the cassiterite phase and its optical properties are practically the same as the tin oxide layer without copper addition. The tin and copper percentage ratios of the coating films were measured by surface SEM-EDX and cross-section STEM-EDX analyses. In FIGS. 3A-3D, it has been determined that the coating thickness of the Cu doped tin oxide coated flat glass example is at most 190 nm.

For samples of glassware with Cu and Sn coating, the coating thickness is 20 nm and less. It is known that undesirable iridescent coloration behavior, which is noticeable to the naked eye, is observed at layer thicknesses of 100 nm and more in applications on glass (U.S. Pat. No. 4,187,336 patent publication). If thick layers are selected in practice, it is possible to remove the iridescence permanently by using one or more dielectric layers that suppresses color (U.S. Pat. No. 4,187,336 patent publication).

TABLE 1

SEM-EDX analysis results taken from the surface of the Cu and Sn coated flat glass sample (@8 kV)

| Analysis | O % | Na % | Mg % | Al % | Si % | S % | Ca % | Cu % | Sn % |
|---|---|---|---|---|---|---|---|---|---|
| 1 | 23.93 | 0.19 | 0.02 | 0.17 | 0.37 | 1.29 | N/A | 1.38 | 72.65 |
| 2 | 24.48 | 0.2 | N/A | 0.06 | 0.43 | 1.24 | 0.15 | 1.56 | 71.88 |
| 3 | 24.46 | 0.15 | N/A | 0.13 | 0.25 | 1.06 | N/A | 1.4 | 72.55 |
| 4 | 24.58 | 0.12 | 0.04 | 0.18 | 0.4 | 1.17 | 0.01 | 1.4 | 72.09 |
| Average | 24.36 | 0.16 | 0.02 | 0.14 | 0.36 | 1.19 | 0.04 | 1.44 | 72.29 |

Tin sources are also used as a hot end coating material in the solution. Thus, inorganic coatings with high scratch/mechanical strength, heat resistance, and detergent resistance are obtained. Another advantage of tin (IV) oxide-based coatings is that their refraction index of about 2 in the visible region is lower than that of titanium dioxide whose refraction index is 2.5-2.6 and display similar levels of antimicrobial activity. Due to the relatively low refraction index in the visible region, undesired coloring/reflection effects due to thickness inhomogeneity are less pronounced. Thus, it can tolerate higher thickness variations that may occur during application.

There is no need for active chemical agent release to obtain the antimicrobial effect in the said coating. The release properties of the basic metal elements in the coating content from the surface were measured by the ICP-OES method.

TABLE 3

Release values obtained in 24 ± 0.5 hours at 22 ± 2° C. by using 4% acetic acid solution.

| Surface Area ($dm^2$) | Cu release ($mg/dm^2$) | Sn release ($mg/dm^2$) |
|---|---|---|
| 0.603 | 0.0200 | 0.0006 |

The high temperature process in an open atmosphere contributes to the formation of an oxide coating. The release can be minimized by using an oxide layer that does not contain high mobility free ions and has strong thermal, mechanical, and chemical stability. Our thin-film coating according to the invention contains a high proportion of tin oxide (tin (IV) oxide) and copper additive homogeneously distributed throughout the coating cross section.

TABLE 4

Antiviral and antibacterial activity results according to relevant standards

| | Bacteria (ISO 22196) | | Virus (ISO 21702) | | | |
|---|---|---|---|---|---|---|
| | | | Poliovirus | Adenovirus | Murine Norovirus | B. |
| Name | E. coli | S. Aureus | Type-1 | Type-5 | Type 1 S99 | Coronavirus |
| Strain | ATCC 8739 | ATCC 6538 | ATCC VR-192 | Adenoid 75, ATCC VR-5 | ATCC-PTA 5935 | ATCC VR-874 |
| Reduction (%) | >90% | >90% | >90% | >90% | >90% | >90% |

The coating solution of the invention can be applied directly to glasses at high temperatures. The layer structure formed with the coating solution can be thermally tempered. At the same time, it offers streamlined production and cost advantage since there is no need for a secondary heat treatment for firing after cold end application on glass.

The scope of protection of the invention is specified in the attached claims and it cannot be limited to what is explained in this detailed description for the sake of example. It is clear that a person skilled in the art can provide similar embodiments in the light of the above, without departing from the main theme of the invention.

What is claimed is:

1. An antimicrobial coating developed to be applied to glass surfaces, wherein the antimicrobial coating comprises at least one copper salt in a hydrate form and at least one tin source, and wherein the at least one tin source comprises dibutyl tin diacetate.

2. The antimicrobial coating according to claim 1, wherein the at least one copper salt further comprises at least one of copper(II) sulfate, copper(II) chloride, and copper(II) nitrate in a predetermined proportion.

3. The antimicrobial coating according to claim 1, wherein the at least one tin source further comprises at least one of monobutyltin trichloride and tin tetrachloride in a predetermined proportion.

4. The antimicrobial coating according to claim 1, wherein the glass surfaces comprise flat glass, wherein a thickness of the antimicrobial coating on the flat glass is at most 200 nm after pyrolytic spray or atmospheric chemical vapor settling methods, and wherein the temperature of the glass surfaces is 400° C. and higher.

5. The antimicrobial coating according to claim 1, wherein the glass surfaces comprise glassware, wherein a thickness of the antimicrobial coating on the glassware is at most 20 nm after pyrolytic spray or atmospheric chemical vapor settling methods, and wherein the temperature of the glass surfaces is 400° C. and higher.

6. The antimicrobial coating according to claim 1, wherein the antimicrobial coating is a coating without a chemical release from a coating surface to an environment after pyrolytic spray or atmospheric chemical vapor settling methods, and wherein the temperature of the glass surfaces is 400° C. and higher.

7. The antimicrobial coating according to claim 1, wherein the antimicrobial coating is configured to be tempered.

8. The antimicrobial coating according to claim 1, wherein an antibacterial effect of the antimicrobial coating against *E. Coli* and *S. Aureus* bacteria is at least 90% according to an ISO 22196 standard after pyrolytic spray or atmospheric chemical vapor settling methods, and wherein the temperature of the glass surfaces is 400° C. and higher.

9. The antimicrobial coating according to claim 1, wherein an antiviral effect of the antimicrobial coating against Poliovirus Type-1, Adenovirus Type-5, Murine Norovirus Type 1 S99, and B. Coronavirus viruses is at least 90% according to an ISO 21702 standard after pyrolytic spray or atmospheric chemical vapor settling methods, and wherein the temperature of the glass surfaces is 400° C. and higher.

* * * * *